(12) United States Patent
Cosand (10) Patent No.: US 10,666,248 B1
(45) Date of Patent: May 26, 2020

(54) CIRCUIT AND METHOD FOR BIASING TRANSISTOR (71) Applicant: HRL Laboratories, LLC, Malibu, CA (US)

(72) Inventor: Albert E. Cosand, Agoura Hills, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 16/387,532

(22) Filed: Apr. 18, 2019

(51) Int. Cl.
H03K 17/16 (2006.01)
H03F 3/45 (2006.01)

(52) U.S. Cl.
CPC ....... H03K 17/165 (2013.01); H03F 3/45071 (2013.01); H03F 2200/129 (2013.01); H03F 2200/156 (2013.01); H03F 2200/471 (2013.01); H03F 2203/45116 (2013.01); H03F 2203/45534 (2013.01)

(58) Field of Classification Search
CPC .............. H03K 17/165; H03F 3/45071; H03F 2200/129; H03F 2200/471; H03F 2203/45116; H03F 2203/45534
See application file for complete search history.

(56) References Cited

U.S. PATENT DOCUMENTS

| 6,556,081 B2* | 4/2003 | Muza | H03F 1/308 330/253 |
| 7,109,794 B2* | 9/2006 | Killat | H03F 3/45183 330/253 |
| 8,130,038 B2* | 3/2012 | Chang | H03F 3/3022 330/255 |

* cited by examiner

Primary Examiner — Dinh T Le
(74) Attorney, Agent, or Firm — Ladas & Parry (57) ABSTRACT A circuit biases an input transistor by using a voltage on a reference transistor having open gate connection and operating at the same current density as the input transistor to null current leakage at the gate of the input transistor. The input transistor is biased based on the voltage on the zero-gate-current reference transistor. The bias condition for the input transistor to operate at a zero gate current is determined by leaving the gate terminal of the reference transistor open-circuited, thus zero gate current, forcing a desired current through the reference transistor, and measuring a drain-source voltage of the reference transistor. When the input terminal of the input transistor has an ancillary circuitry that may contribute gate leakage current, the same ancillary circuitry can be coupled to the gate of the reference transistor.

19 Claims, 5 Drawing Sheets

CIRCUIT AND METHOD FOR BIASING TRANSISTOR

STATEMENT REGARDING FEDERALLY SPONSORED RESEARCH OR DEVELOPMENT

This invention was made with support from the United States Government. The United States Government has certain rights in the invention.

TECHNICAL FIELD

The present disclosure generally relates to electronic circuit design. More specifically, certain embodiments of the present disclosure relate to a circuit and method for biasing an input transistor so as to reduce a gate leakage current.

BACKGROUND

A circuit with extremely low input bias current, such as an amplifier or a buffer circuit, may use insulated gate field effect transistors, for example, Metal Oxide Semiconductor Field Effect Transistors (MOSFETs) as an input device. MOSFETs have a gate electrode which is electrically insulated from the main semiconductor n-channel or p-channel by a very thin layer of insulating material named gate oxide. The gate oxide can be a silicon dioxide. In manufacturing processes using MOSFETs, for example complementary MOS (CMOS) manufacturing processes, continually thinner gate oxides of MOSFETs have been a critical feature of the overall scaling-down of transistor dimensions to achieve higher density of circuitry and lower power dissipation. However, a reduction in the gate oxide thickness causes undesirable leakage current at the gate through the thin oxide gate dielectric due to tunneling. To reduce the current leakage at the gate, some conventional art has used a thicker gate dielectric which requires a much larger transistor in order to design for low noise, thus limiting the density of the circuitry. Accordingly, the gate current leakage can be a limiting factor in further device down-scaling.

Further limitations and disadvantages of conventional and traditional approaches will become apparent to one of skill in the art, through comparison of such systems with some aspects of the present disclosure as set forth in the remainder of the present disclosure.

SUMMARY

The features and advantages of the present disclosure will be more readily understood and apparent from the following detailed description, which should be read in conjunction with the accompanying drawings, and from the claims which are appended to the end of the detailed description.

A circuit is disclosed having a bias control circuit for biasing an input transistor by using a voltage on a reference transistor having an open gate connection and operating at the same current density as the input transistor to null current leakage at the gate of the input transistor.

According to various exemplary embodiments, a circuit may comprise: a differential pair of first and second input transistors; a reference transistor having a gate open-circuited, and operating at the same current density as the differential pair of first and second input transistors; and a bias control circuit coupled to the differential pair of first and second input transistors and the reference transistor, and configured to bias the differential pair of first and second input transistors by using a voltage on the reference transistor. The bias control circuit may be configured to bias the differential pair of the first and second input transistors so that the differential pair of the first and second input transistors are operated at the same voltage as the reference transistor. The bias control circuit may be configured to: sense drain-source voltages of the reference transistor and the differential pair of first and second input transistors, and drive drain voltages of the differential pair of first and second input transistors so that the drain-source voltage of the differential pair of first and second input transistors match the drain-source voltage of the reference transistor.

According to some exemplary embodiments, a circuit may comprise: a differential pair of first and second input transistors; a reference transistor having a gate open-circuited, and operating at the same current density as the differential pair of first and second input transistors; a first cascode transistor coupled to a drain of the reference transistor; a second cascode transistor coupled to a drain of the first input transistor; a third cascode transistor coupled to a drain of the second input transistor; and an amplifier having a first input terminal coupled to a source of the reference transistor, a second input terminal coupled to common sources of the differential pair of first and second input transistors, and an output terminal coupled to gates of the first, second and third cascode transistors. The amplifier may be configured to sense voltage difference between a common source voltage of the differential pair of first and second input transistors and a source voltage of the reference transistor and drive gate voltages of the first, second and third cascode transistors to null the voltage difference.

According to certain exemplary embodiments, a circuit may comprise: a differential pair of first and second input transistors; a reference transistor having a gate open-circuited, and operating at the same current density as the differential pair of first and second input transistors; a first folded cascode transistor coupled to a drain of the reference transistor; a second folded cascode transistor coupled to a drain of the first input transistor; a third folded cascode transistor coupled to a drain of the second input transistor; and an amplifier having a first input terminal coupled to a source of the reference transistor, a second input terminal coupled to common sources of the differential pair of first and second input transistors, and an output terminal coupled to gates of the first, second and third folded cascode transistors. The amplifier may be configured to sense voltage difference between a common source voltage of the differential pair of first and second input transistors and a source voltage of the reference transistor and drive gate voltages of the first, second and third folded cascode transistors to null the voltage difference.

According to some exemplary embodiments, a circuit may comprise: a differential pair of first and second input transistors; a reference transistor having a gate open-circuited, and operating at the same current density as the differential pair of first and second input transistors; a first cascode transistor coupled to the first input transistor; a second cascode transistor coupled to the second input transistor; a first transconductor coupled to the reference transistor and configured to generate a first current proportional to a drain-source voltage of the reference transistor; a second transconductor coupled to the first input transistor configured to generate a second current proportional to a drain-source voltage of the first input transistor, wherein transconductance of the second transconductor has an opposite sign to transconductance of the first transconductor; and a capacitor configured to be charged by a current difference between the first current and the second current, and coupled to gates of the first and second cascode transistors.

According to various exemplary embodiments, a circuit may comprise: an input transistor having a gate coupled to an input terminal; a reference transistor having a gate open-circuited, and operating at the same current density as the input transistor; and a bias control circuit coupled to the input transistor and the reference transistor, and configured to bias the input transistor by using a voltage on the reference transistor. The bias control circuit may comprise an amplifier having a first input terminal coupled to a source of the reference transistor, a second input terminal coupled to a source of the input transistor, and an output terminal coupled to drains of the reference transistor and the input transistor. The bias control circuit may further comprise a capacitor connected to the first input terminal and the output terminal of the amplifier.

According to certain embodiments, a method of biasing an input transistor having a gate coupled to an input terminal may comprise: generating a bias current for a reference transistor having an open gate connection and operating at the same current density as the input transistor; sensing a voltage on the reference transistor; and biasing the input transistor by using the voltage on the reference transistor.

A better understanding of the nature and advantages of the present disclosure may be gained with reference to the detailed description and the drawings below.

BRIEF DESCRIPTION OF THE DRAWINGS

Various embodiments in accordance with the present disclosure will be described with reference to the drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF EMBODIMENTS

In the following detailed description, reference is made to the accompanying drawings which form a part hereof, and in which are shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the invention. The following detailed description is, therefore, not to be taken in a limiting sense, and the scope of the invention is defined only by the appended claims and equivalents thereof. Like numbers in the figures refer to like components.

MOSFETs have a gate electrode which is electrically insulated from the main semiconductor n-channel or p-channel by a very thin layer of insulating material, or gate oxide, usually silicon dioxide. However, due to reduction in the gate oxide thickness, MOSFETs may have undesirable gate leakage currents through the gate dielectric. If MOSFETs are biased such that a drain-source voltage is greater than a gate-source voltage, the gate-source voltage and the gate-drain voltage may have opposite signs, with the result that gate-source leakage and gate-drain voltage have opposite signs to each other. With appropriately chosen bias conditions, the gate-source leakage and the gate-drain leakage may be equal in magnitude, resulting in zero net leakage current at the gate terminal. Further, a bias condition for a MOSFET to operate at a zero gate current may be determined by leaving the gate terminal open-circuited or having an open gate connection, thus having zero gate current, and forcing a desired current through the zero-gate-current transistor and measuring a drain-source voltage. According to an embodiment of the present disclosure, an input transistor may be made to operate with substantially zero gate current when the input transistor is operated at the same drain to source voltage and same current density as a reference transistor with zero gate current. Accordingly, in some preferred embodiments of the present disclosure, a circuit may bias the input transistor by using a voltage on the reference transistor having zero gate current so as to minimize or null gate leakage current at the input transistor. For example, the bias voltages of input transistor may be set by replicating voltages on the reference transistor that has an open gate connection and operates at the same current density as the input transistor.

Figure 1:
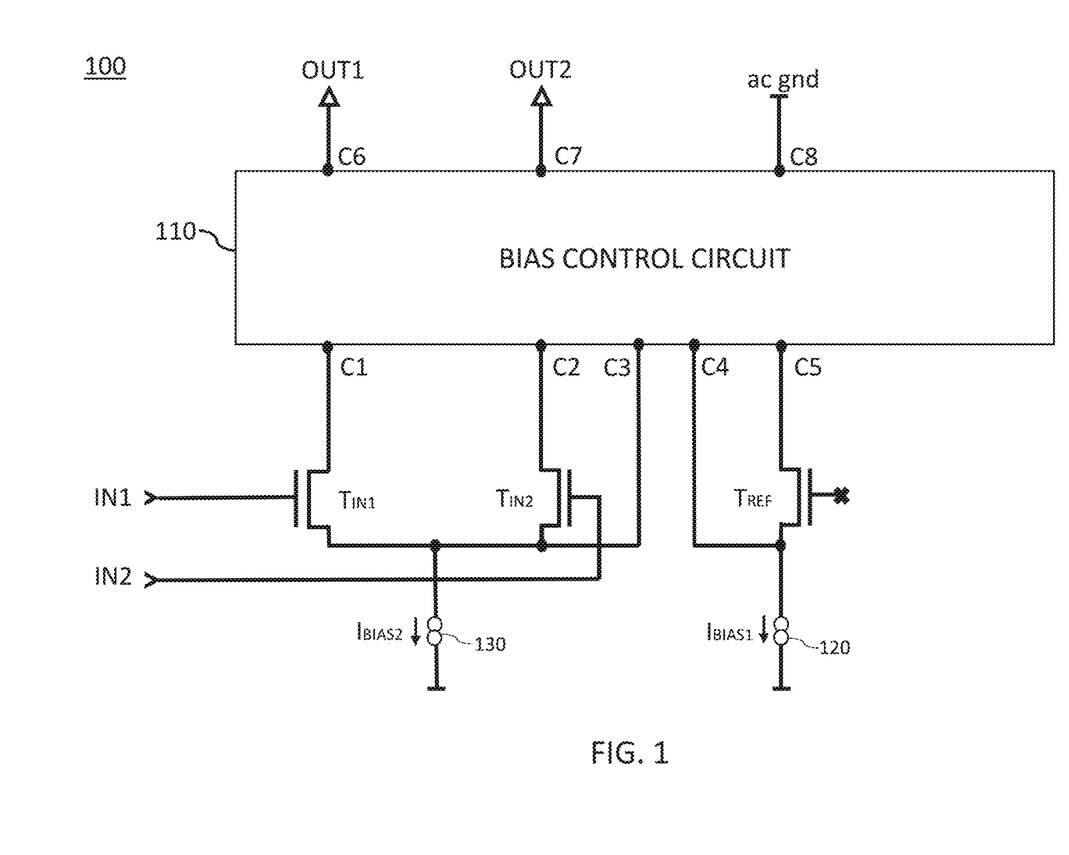
FIG. 1 is a schematic diagram of a circuit in accordance with an embodiment of the present disclosure.

FIG. 1 is a schematic diagram of a circuit in accordance with an embodiment of the present disclosure. The circuit 100 of FIG. 1 may be included in an amplifier, a buffer circuit or any circuits that need an input transistor. The circuit 100 may comprise a reference transistor $T_{REF}$, a differential pair of a first input transistor $T_{IN1}$ and a second input transistor $T_{IN2}$, a bias control circuit 110, a first current generator 120 and a second current generator 130.

The circuit 100 may have a first input terminal IN1 for receiving a first input signal and a second input terminal IN2 for receiving a second input signal. An input stage of the circuit 100 may be formed by the first input transistor $T_{IN1}$, with a gate coupled to the first input terminal IN1, and the second input transistor $T_{IN2}$, with a gate coupled to the second input terminal IN2.

The first input transistor $T_{IN1}$ may have a gate, a drain terminal, and a source terminal. The gate of the first input transistor $T_{IN1}$ may be coupled to the first input terminal IN1. The drain terminal of the first input transistor $T_{IN1}$ may be coupled to the bias control circuit 110 at a terminal C1, and the source terminal of the first input transistor $T_{IN1}$ may be coupled to the second current generator 130 and the bias control circuit 110 at a terminal C3.

The second input transistor $T_{IN2}$ may have a gate, a drain terminal, and a source terminal. The gate of the second input transistor $T_{IN2}$ may be coupled to the second input terminal IN2. The drain terminal of the second input transistor $T_{IN2}$ may be coupled to the bias control circuit 110 at terminal C2, and the source terminal of the second input transistor $T_{IN2}$ may be coupled to the second current generator 130, the bias control circuit 110 at terminal C3 and the source terminal of the first input transistor $T_{IN1}$. The second input transistor $T_{IN2}$ may have the same characteristics as the first input transistor $T_{IN1}$ (for example, they may have the same layout within an integrated circuit, or may be of the same manufacturer and model number).

The first current generator 120 may supply a bias current $I_{BIAS1}$ for the reference transistor $T_{REF}$. The first current generator 120 forces a desired bias current to the reference transistor $T_{REF}$. One terminal of the first current generator 120 may be coupled to the source terminal of the reference transistor $T_{REF}$. The other terminal of the first current generator 120 may be coupled to any appropriate component or part of, for example, but not limited to, an amplifier or a buffer circuit, e.g. an ac ground.

The second current generator 130 may supply a bias current $I_{BIAS2}$ for the first input transistor $T_{IN1}$ and the second input transistor $T_{IN2}$. The second current generator 130 forces desired bias currents to the first input transistor $T_{IN1}$ and the second input transistor $T_{IN2}$. One terminal of the second current generator 130 may be coupled to the common sources of a differential pair formed by the first input transistor $T_{IN1}$ and the second input transistor $T_{IN2}$. The other terminal of the second current generator 130 may be coupled to any appropriate component or part of, for example, but not limited to, an amplifier or a buffer circuit, e.g. an ac ground.

As illustrated in FIG. 1, the second current generator 130 may be coupled to both the source terminals of the first input transistor $T_{IN1}$ and the second input transistor $T_{IN2}$. The second current generator 130 may generate a bias current twice that of the first current generator 120 for the first input transistor $T_{IN1}$ and the second input transistor $T_{IN2}$. However, the second current generator 130 may comprise two separate current generators, one coupled to the source terminal of the first input transistor $T_{IN1}$ and the other coupled to the source terminal of the second input transistor $T_{IN2}$. One current generator may generate a bias current equal to that of the first current generator 120 for the first input transistor $T_{IN1}$ while the other current generator may generate a bias current equal to that of the first current generator 120 for the second input transistor $T_{IN2}$. However, when the size of the first input transistor $T_{IN1}$ or the second input transistor $T_{IN2}$ is different from the reference transistor $T_{REF}$ while their current densities are the same, the bias currents for the first input transistor $T_{IN1}$, the second input transistor $T_{IN2}$ and the reference transistor $T_{REF}$ may be different from each other and be scaled according to the transistor sizes.

The bias currents $I_{BIAS1}$ and $I_{BIAS2}$ may have the same value when the reference transistor $T_{REF}$ and the first input transistor $T_{IN1}$ are identical transistors or have a same configuration. However, if the size of the first input transistor $T_{IN1}$ is different from that of the reference transistor $T_{REF}$, the bias currents $I_{BIAS1}$ and $I_{BIAS2}$ may be scaled according to the respective sizes of the reference transistor $T_{REF}$ and the first input transistor $T_{IN1}$ to maintain the same current densities.

The reference transistor $T_{REF}$ may have a gate, a drain terminal, and a source terminal. The gate of the reference transistor $T_{REF}$ may have an open gate connection or be open circuited, thus having zero gate current.

The reference transistor $T_{REF}$ may operate at the same current density as the first input transistor $T_{IN1}$ (and/or the second input transistor $T_{IN2}$). For example, the reference transistor $T_{REF}$ may have the same characteristics as the first input transistor $T_{IN1}$ (and/or the second input transistor $T_{IN2}$) (for example, they may have the same layout within an integrated circuit). Alternatively, the size and/or bias current of the first input transistor $T_{IN1}$ and the reference transistor $T_{REF}$ may be different from each other as long as the first input transistor $T_{IN1}$ (and/or the second input transistor $T_{IN2}$) and the reference transistor $T_{REF}$ are scaled, e.g. in width, to operate at the same current density.

The bias control circuit 110 may be coupled to the drain and source terminals of the first input transistor $T_{IN1}$ at terminals C1 and C3, respectively, and the drain and source terminals of the reference transistor $T_{REF}$ at terminals C5 and C4, respectively. The drain and source terminals of the second transistor $T_{IN2}$ may also be coupled to the bias control circuit 110, at terminals C2 and C3, respectively. The bias control circuit 110 may also be coupled to any appropriate component or part of, for example, but not limited to, a current generator, an amplifier or a buffer circuit, e.g. an ac ground. For example, the bias control circuit may be coupled into the remainder of an amplifier circuit through a first output terminal OUT1 at a terminal C6 and a second output terminal OUT2 at a terminal C7, and be coupled to an ac ground at a terminal C8. A single such coupling is illustrated in FIG. 1; however, it is understood that there may be multiple such couplings, depending on the details of the circuitry comprising the bias control circuit 110.

The bias control circuit 110 may be configured to bias the first input transistor $T_{IN1}$ and/or the second input transistor $T_{IN2}$ by using a voltage on the zero-gate-current reference transistor $T_{REF}$. For example, the bias control circuit 110 can sense a drain, source or drain-source voltage of the reference transistor $T_{REF}$ having a zero gate current and can drive a corresponding drain, source or drain-source voltage on the first and/or second input transistors $T_{IN1}$ and/or $T_{IN2}$ so that the drain, source or drain-source voltage on the first and/or second input transistors $T_{IN1}$ and/or $T_{IN2}$ can be substantially equal to the corresponding drain, source or drain-source voltage of the zero-gate-current reference transistor $T_{REF}$. In an example, the bias control circuit 110 senses drain-source voltages of the zero-gate-current reference transistor $T_{REF}$ and the first input transistor $T_{IN1}$ and drives the drain voltage of the first input transistor $T_{IN1}$ so that the drain-source voltage of the first input transistor $T_{IN1}$ becomes substantially identical to the drain-source voltage of the zero-gate-current reference transistor $T_{REF}$. Alternatively, the bias control circuit 110 may sense a difference voltage between the drain, source or drain-source voltage on the first and/or second input transistor $T_{IN1}$ and/or $T_{IN2}$ and the drain, source or drain-source voltage on the zero-gate-current reference transistor $T_{REF}$, and control the drain, source or drain-source voltage on the first and/or second input transistor $T_{IN1}$ and/or $T_{IN2}$ so that the sensed different voltage can be nulled. Therefore, the bias control circuit 110 can bias the first and/or second input transistor $T_{IN1}$ and/or $T_{IN2}$ so as to minimize or null gate leakage current.

An ancillary circuitry that may contribute gate leakage current may be coupled to the first input terminal IN1 and/or the second input terminal IN2. For example, a diode for protecting an input transistor can be coupled to the input terminal of the input transistor. In that case, the gate of the zero-gate-current reference transistor $T_{REF}$ may be coupled to another ancillary circuitry. The ancillary circuitry coupled to the gate of the reference transistor $T_{REF}$ may be a duplicate of the ancillary circuitry coupled to the input terminal IN1 and/or IN2. By coupling another ancillary circuitry, which is a copy of the ancillary circuitry coupled to the input terminal IN1 and/or IN2, to the gate of the reference transistor $T_{REF}$, the operating point of the reference transistor $T_{REF}$ may be such as to create a leakage current that cancels the leakage by the ancillary circuitry coupled to the input transistor $T_{IN1}$ and/or $T_{IN2}$.

In the circuit diagram of FIG. 1, the transistors T1 and T2 are each illustrated as N-type transistors. However, one skilled in the art will recognize that other transistor types including P-type transistors could be used instead of the N-type transistors shown in this illustrative example.

Figure 2:
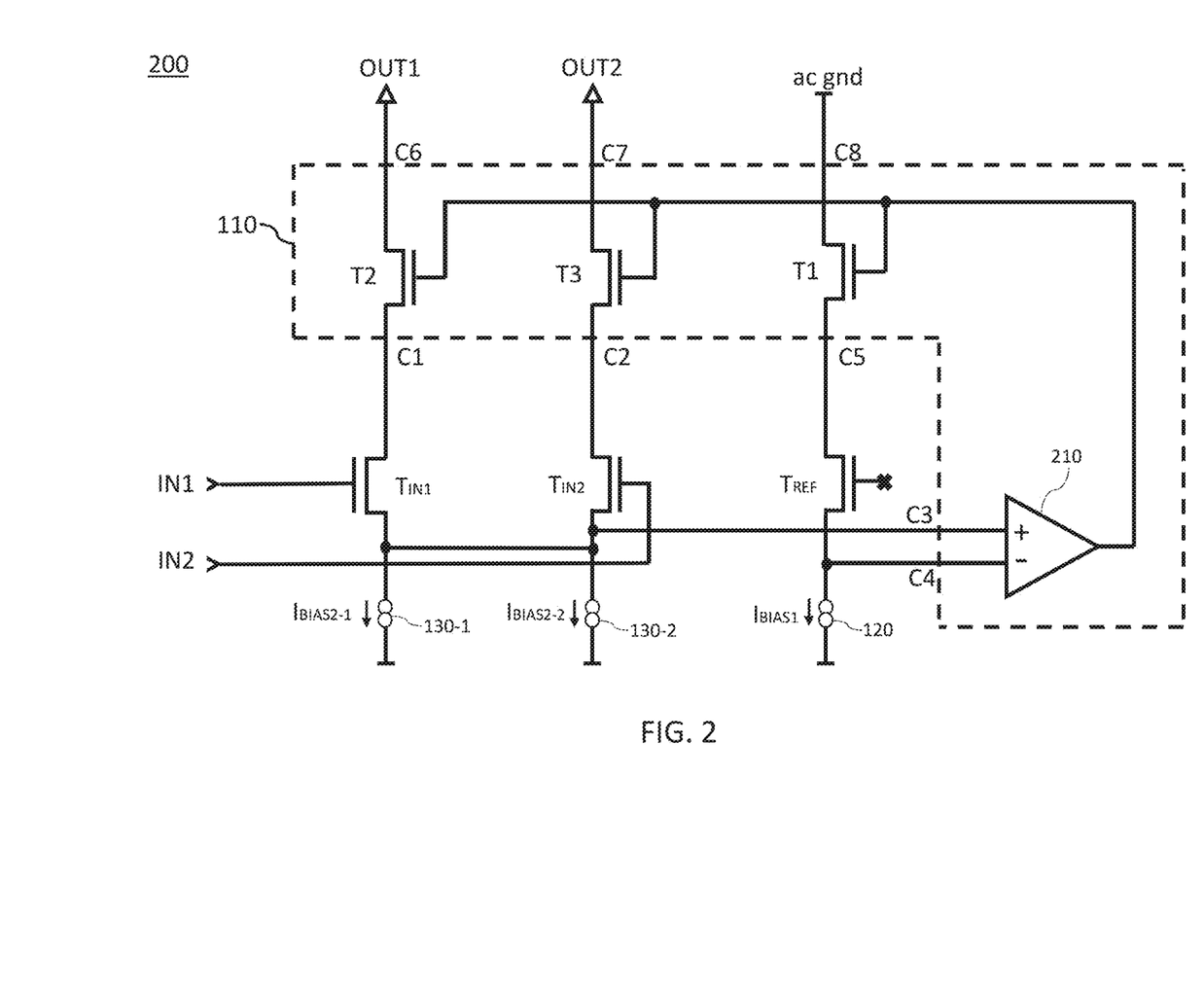
FIG. 2 illustrates an embodiment where a bias control circuit is a simple cascode circuit.

FIG. 2 illustrates an exemplary embodiment 200 where the bias control circuit 110 is a simple cascode circuit. The "simple cascode" circuit 200 of FIG. 2 may be included in an amplifier, a buffer circuit or any circuit that has an input transistor. The circuit 200 may comprise a reference transistor $T_{REF}$, a differential pair of a first input transistor $T_{IN1}$ and a second input transistor $T_{IN2}$, a first cascode transistor T1, a second cascode transistor T2, a third cascode transistor T3, an amplifier 210, a first current generator 120, a second current generator 130-1, and a third current generator 130-2.

The circuit 200 may have a first input terminal IN1 for receiving a first input signal and a second input terminal IN2 for receiving a second input signal. An input stage of the circuit 200 is formed by a first input transistor $T_{IN1}$, with a gate coupled to the first input terminal IN1, and a second input transistor $T_{IN2}$, with a gate coupled to the second input terminal IN2. For example, the first input transistor $T_{IN1}$ and the second input transistor $T_{IN2}$ may be input differential pair transistors of an amplifier. The first input terminal IN1 may be a positive (or non-inverting) input terminal and the second input terminal IN2 may be a negative (or inverting) input terminal. In this embodiment, the drain currents of the second and third cascode transistors T2 and T3 may be coupled into the remainder of the amplifier circuit through a first output terminal OUT1 and a second output terminal OUT2, respectively. The drain current of the first cascode transistor T1 is returned to a suitable potential that serves as an ac ground.

The first input transistor $T_{IN1}$ may have a gate, a drain terminal and a source terminal. The gate of the first input transistor $T_{IN1}$ may be coupled to the first input terminal IN1. The drain terminal of the first input transistor $T_{IN1}$ may be coupled to the source terminal of the second cascode transistor T2, and the source terminal of the first input transistor $T_{IN1}$ may be coupled to the second current generator 130-1. The second input transistor $T_{IN2}$ may have a gate, a drain terminal and a source terminal. The gate of the second input transistor $T_{IN2}$ may be coupled to the second input terminal IN2. The drain terminal of the second input transistor $T_{IN2}$ may be coupled to the source terminal of the third cascode transistor T3 while the source terminal of the second input transistor $T_{IN2}$ may be coupled to the third current generator 130-2. The second input transistor $T_{IN2}$ may have the same characteristics as the first input transistor $T_{IN1}$ (for example, they may have the same layout within an integrated circuit).

The reference transistor $T_{REF}$ may have a gate, a drain terminal, and a source terminal. The gate of the reference transistor $T_{REF}$ may have an open gate connection or be open circuited, thus having zero gate current.

The reference transistor $T_{REF}$ may operate at the same current density as the first input transistor $T_{IN1}$ (and/or the second input transistor $T_{IN2}$). For example, the reference transistor $T_{REF}$ may have the same characteristic as the first input transistor $T_{IN1}$ (and/or the second input transistor $T_{IN2}$) (for example, they may have the same layout within an integrated circuit). Alternatively, the size and/or bias current of the first input transistor $T_{IN1}$ (and/or the second input transistor $T_{IN2}$) and the reference transistor $T_{REF}$ may be different from each other as long as the first input transistor $T_{IN1}$ (and/or the second input transistor $T_{IN2}$) and the reference transistor $T_{REF}$ are scaled in width to operate at the same current density.

The drain terminal of the reference transistor $T_{REF}$ may be coupled to the source terminal of the first cascode transistor T1 while the source terminal of the reference transistor $T_{REF}$ may be coupled to the first current generator 120.

The first current generator 120 may supply a first bias current $I_{BIAS1}$ for the reference transistor $T_{REF}$. The first current generator 120 forces a desired bias current to the reference transistor $T_{REF}$. One terminal of the first current generator 120 may be coupled to the source of the reference transistor $T_{REF}$. The other terminal of the first current generator 120 may be coupled to any appropriate component or part of, for example, but not limited to, an amplifier or a buffer circuit, e.g. an ac ground.

The second current generator 130-1 and the third current generator 130-2 may generate a second bias current $I_{BIAS2-1}$ and a third bias current $I_{BIAS2-2}$, respectively, for the differential pair of the input transistors $T_{IN1}$ and $T_{IN2}$. The second and third current generators 130-1 and 103-2 force a desired bias current to the differential pair of the input transistors $T_{IN1}$ and $T_{IN2}$. One terminal of each of the second current generator 130-1 and the third current generator 130-2 may be coupled to the common sources of the input transistors $T_{IN1}$ and $T_{IN2}$. The other terminal of each of the second current generator 130-1 and the third current generator 130-2 may be coupled to any appropriate component or part of, for example, but not limited to, an amplifier or a buffer circuit, e.g. a circuit ground potential.

The bias currents $I_{BIAS1}$, $I_{BIAS2-1}$ and $I_{BIAS2-2}$ may all have the same value when the reference transistor $T_{REF}$, the first input transistor $T_{IN1}$ and the second input transistor $T_{IN2}$ are identical transistors or have the same configuration. However, when the size of the first input transistor $T_{IN1}$ or the second input transistor $T_{IN2}$ is different from the reference transistor $T_{REF}$, the bias currents $I_{BIAS1}$, $I_{BIAS2-1}$ and $I_{BIAS2-2}$ may be different from each other and be scaled according to the transistor sizes to maintain the same current densities in the reference and input transistors.

The bias control circuit 110 may comprise the amplifier 210, the first cascode transistor T1 and the second cascode transistor T2. The bias control circuit 110 may further comprise the third cascode transistor T3. The transistors T1, T2 and T3 may be identical transistors.

The amplifier 210 is used to control the gate voltages of the first cascode transistor T1, the second cascode transistor T2 and the third cascode transistor T3. For example, the amplifier 210 may be an operational amplifier. A negative (inverting) input terminal of the amplifier 210 may be coupled to the source of the reference transistor $T_{REF}$, while a positive (non-inverting) input terminal of the amplifier 210 may be coupled to the source of the first input transistor $T_{IN1}$ and/or the second input transistor $T_{IN2}$. An output terminal of the amplifier 210 may be coupled to the gates of the first cascode transistor T1, the second cascode transistor T2 and the third cascode transistor T3.

In operation, the amplifier 210 may sense a voltage difference between the source voltage of the first input transistor $T_{IN1}$ or the second input transistor $T_{IN1}$ and the source voltage of the reference transistor $T_{REF}$, and control the gate voltages for the first cascode transistor T1, the second cascode transistor T2 and the third cascode transistor T3 to drive the drain voltage of the first input transistor $T_{IN1}$ or the second input transistor $T_{IN2}$ in order to null the sensed voltage difference. The first cascode transistor T1, the second cascode transistor T2 and the third cascode transistor T3 may operate at the same current density and therefore have the same source voltage to drive the drain-source voltage of the first input transistor $T_{IN1}$ (or the second input transistor $T_{IN2}$) to be substantially equal to the drain-source voltage of the zero-gate-current reference transistor $T_{REF}$.

If extremely precise cancellation of the gate leakage current is needed, the input transistors $T_{IN1}$ and $T_{IN2}$ may have feedback that forces the gates of the input transistors $T_{IN1}$ and $T_{IN2}$ to the same voltage, so that the drain currents of the input transistors $T_{IN1}$ and $T_{IN2}$ are equal.

The drain terminals of the cascode transistors T1, T2 and T3 may be coupled to any appropriate component or part of, for example, but not limited to, an amplifier or a buffer circuit. For example, the drain terminals of the second cascode transistor T2 and the third cascode transistor T3 are coupled to the remainder of the amplifier circuit through the first output terminal OUT1 and the second output terminal OUT2, respectively, and the drain terminal of the first cascode transistor T1 is coupled to an ac ground.

An ancillary circuitry that may contribute gate leakage current may be coupled to the first input terminal IN1 and/or the second input terminal IN2. For example, a diode for protecting an input transistor can be coupled to the input terminal of the input transistor. In that case, the gate of the zero-gate-current reference transistor $T_{REF}$ may be coupled to another ancillary circuitry. The ancillary circuitry coupled to the gate of the reference transistor $T_{REF}$ may be a copy of the ancillary circuitry coupled to the input terminal IN1 and/or IN2. By coupling another ancillary circuitry, which is a copy of the ancillary circuitry coupled to the input terminal IN1 and/or IN2, to the gate of the reference transistor $T_{REF}$, the operating point of the reference transistor $T_{REF}$ may be such as to create a leakage current that cancels the leakage by the ancillary circuitry coupled to the input transistor $T_{IN1}$ and/or $T_{IN2}$.

In the circuit diagram of FIG. 2, the transistors $T_{IN1}$, $T_{IN2}$, $T_{REF}$, T1, T2 and T3 are each illustrated as N-type transistors. However, one skilled in the art will recognize that other transistor types including P-type transistors could be used instead of the N-type transistors shown in this illustrative example.

Figure 3:
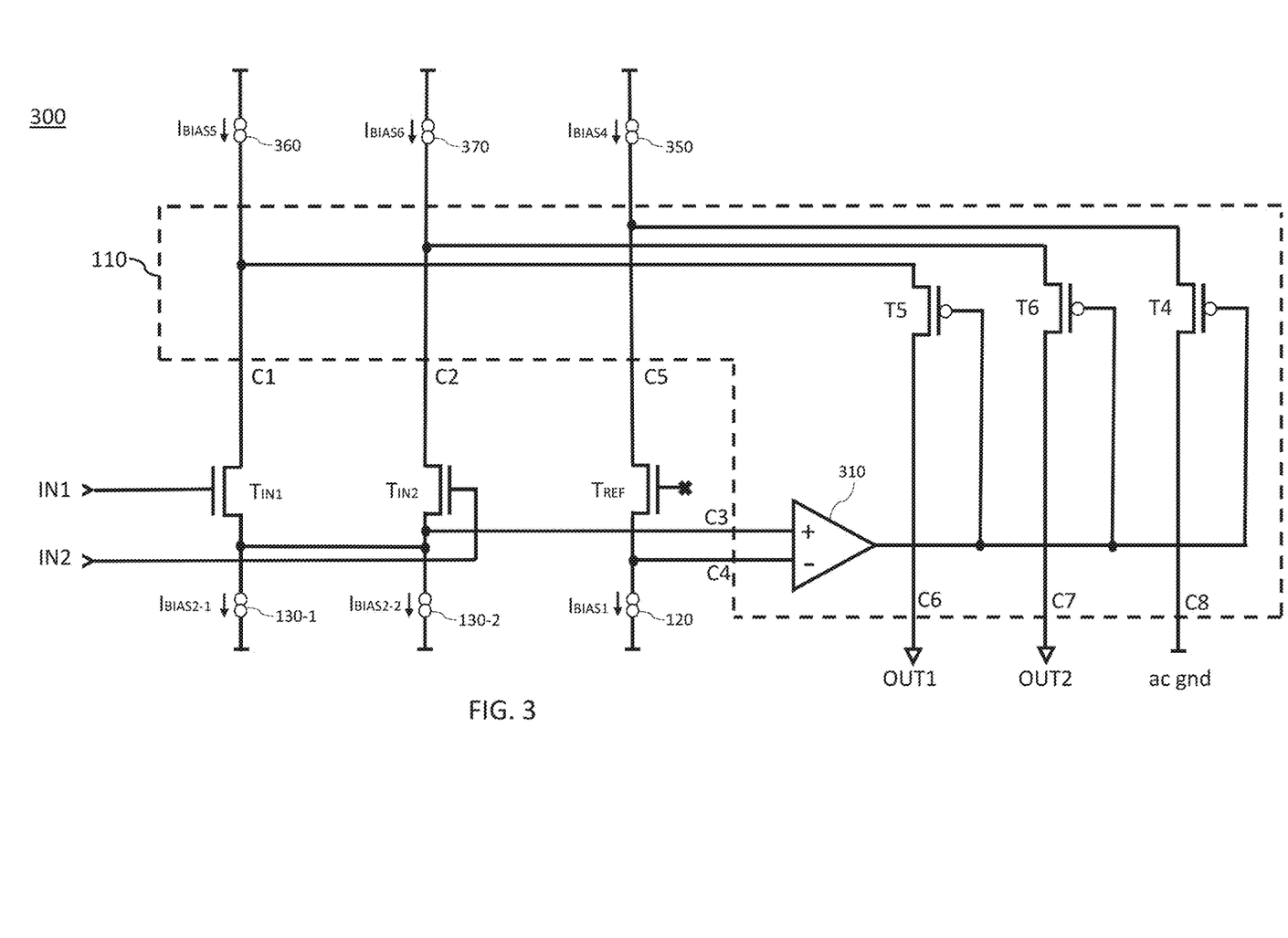
FIG. 3 shows an embodiment where a bias control circuit is a folded cascode circuit.

FIG. 3 illustrates an exemplary embodiment 300 in which the bias control circuit 110 is a folded cascode circuit. The "folded cascode" circuit 300 may be included in an amplifier, a buffer circuit or any circuit that has an input transistor. The circuit 300 of FIG. 3 may comprise a reference transistor $T_{REF}$, a differential pair of a first input transistor $T_{IN1}$ and a second input transistor $T_{IN2}$, a first folded cascode transistor T4, a second folded cascode transistor T5, a third folded cascode transistor T6, an amplifier 310, a first current generator 120, a second current generator 130-1, a third current generator 130-2, a fourth current generator 350, a fifth current generator 360 and a sixth current generator 370.

The circuit 300 may have a first input terminal IN1 for receiving a first input signal and a second input terminal IN2 for receiving a second input signal. An input stage of the circuit 300 is formed by a first input transistor $T_{IN1}$, with a gate coupled to the first input terminal IN1, and a second input transistor $T_{IN2}$, with a gate coupled to the second input terminal IN2. For example, the first input transistor $T_{IN1}$ and the second input transistor $T_{IN2}$ may be an input differential pair transistors of an amplifier. The first input terminal IN1 may be a positive (non-inverting) input terminal while the second input terminal IN2 may be a negative (inverting) input terminal. In this embodiment, the drain currents of the second and third folded cascode transistors T5 and T6 may be coupled into the remainder of the amplifier circuit through a first output terminal OUT1 and a second output terminal OUT2, respectively. The drain current of the first folded cascode transistor T4 is returned to a suitable potential that serves as an ac ground.

The first input transistor $T_{IN1}$ may have a gate, a drain terminal and a source terminal. The gate of the first input transistor $T_{IN1}$ may be coupled to the first input terminal IN1. The drain terminal of the first input transistor $T_{IN1}$ may be coupled to the source terminal of the second folded cascode transistor T5, and the source terminal of the first input transistor $T_{IN1}$ may be coupled to the second current generator 130-1. The second input transistor $T_{IN2}$ may have a gate, a drain terminal and a source terminal. The gate of the second input transistor $T_{IN2}$ may be coupled to the second input terminal IN2. The drain terminal of the second input transistor $T_{IN2}$ may be coupled to the source terminal of the third folded cascode transistor T6, and the source terminal of the second input transistor $T_{IN2}$ may be coupled to the third current generator 130-2. The second input transistor $T_{IN2}$ may be identical to the first input transistor $T_{IN1}$.

The reference transistor $T_{REF}$ may have a gate, a drain terminal, and a source terminal. The gate of the reference transistor $T_{REF}$ may have an open gate connection or be open circuited, thus having zero gate current.

The reference transistor $T_{REF}$ may operate at the same current density as the first input transistor $T_{IN1}$ (and/or the second input transistor $T_{IN1}$). For example, the reference transistor $T_{REF}$ may have the same characteristic as the first input transistor $T_{IN1}$ (and/or the second input transistor $T_{IN2}$) (for example, they may have the same layout within an integrated circuit). Alternatively, consistently with the previously described embodiments, the size and/or bias current of the first input transistor $T_{IN1}$ (and/or the second input transistor $T_{IN2}$) and the reference transistor $T_{REF}$ may be different from each other as long as the first input transistor $T_{IN1}$ (and/or the second input transistor $T_{IN2}$) and the reference transistor $T_{REF}$ are of the same length and are scaled in width to operate at the same current density.

The drain terminal of the reference transistor $T_{REF}$ may be coupled to the source terminal of the first folded cascode transistor T4 while the source terminal of the reference transistor $T_{REF}$ may be coupled to the first current generator 120.

The first current generator 120 may generate a first bias current $I_{BIAS1}$ for the reference transistor $T_{REF}$. The first current generator 120 forces a desired bias current to the reference transistor $T_{REF}$. One terminal of the first current generator 120 may be coupled to the source of the reference transistor $T_{REF}$. The other terminal of the first current generator 120 may be coupled to any appropriate component or part of, for example, but not limited to, an amplifier or a buffer circuit, e.g. a circuit ground potential.

The second current generator 130-1 may generate a second bias current $I_{BIAS2-1}$ for the first input transistor $T_{IN1}$. The second current generator 130-1 forces a desired bias current to the first input transistor $T_{IN1}$. One terminal of the second current generator 130-1 may be coupled to the source of the first input transistor $T_{IN1}$. The other terminal of the second current generator 130-1 may be coupled to any component or part of, for example, but not limited to, an amplifier or a buffer circuit, e.g. a circuit ground potential.

The third current generator 130-2 may generate a third bias current $I_{BIAS2-2}$ for the second input transistor $T_{IN2}$. The third current generator 130-2 forces a desired bias current to the second input transistor $T_{IN2}$. One terminal of the third current generator 130-2 may be coupled to the source of the second input transistor $T_{IN2}$. The other terminal of the third current generator 130-2 may be coupled to any component or part of, for example, but not limited to, an amplifier or a buffer circuit, e.g. a circuit ground potential.

The bias currents $I_{BIAS1}$, $I_{BIAS2}$ and $I_{BIAS3}$ may be all have the same value when the reference transistor $T_{REF}$, the first input transistor $T_{IN1}$ and the second input transistor $T_{IN2}$ are identical transistors or have the same configuration. However, when the size of the first input transistor $T_{IN1}$ and the second input transistor $T_{IN2}$ is different from the reference transistor $T_{REF}$, the bias currents $I_{BIAS1}$, $I_{BIAS2}$ and $I_{BIAS3}$ may be different from each other and be scaled according to the transistor sizes to maintain the same current densities.

The bias control circuit 110 may comprise the amplifier 310, the first folded cascode transistor T4 and the second folded cascode transistor T5. The bias control circuit 110 may further comprise the third folded cascode transistor T6. The folded cascode transistors T4, T5 and T6 may be identical transistors.

The amplifier 310 is used to control the gate voltages of the first folded cascode transistor T4, the second folded cascode transistor T5 and the third folded cascode transistor T6. For instance, the amplifier 310 may be an operational amplifier. A negative (inverting) input terminal of the amplifier 310 may be coupled to the source of the reference transistor $T_{REF}$. A positive (non-inverting) input terminal of the amplifier 310 may be coupled to the source of the first input transistor $T_{IN1}$ and/or the second input transistor $T_{IN2}$. An output terminal of the amplifier 310 may be coupled to the gates of the first folded cascode transistor T4, the second folded cascode transistor T5 and the third folded cascode transistor T6. The drain voltages of the transistors $T_{IN1}$, $T_{IN2}$ and $T_{REF}$ may be maintained at the same potential by the folded cascode (common-gate) transistors T4, T5 and T6.

In operation, the amplifier 310 may sense a voltage difference between the source voltage of the first input transistor $T_{IN1}$ (or the second input transistor $T_{IN2}$) and the source voltage of the reference transistor $T_{REF}$, and control the gate voltages for the first folded cascode transistor T4, the second folded cascode transistor T5 and the third folded cascode transistor T6 to drive the drain voltage of the first input transistor $T_{IN1}$ or the second input transistor $T_{IN2}$ in order to null the sensed voltage difference. The first folded cascode transistor T4, the second folded cascode transistor T5 and the third folded cascode transistor T6 may operate at the same current and therefore have the same source voltage to drive the drain-source voltage of the first input transistor $T_{IN1}$ (or the second input transistor $T_{IN2}$) to be substantially equal to the drain-source voltage of the zero-gate-current reference transistor $T_{REF}$.

If extremely precise cancellation of the gate leakage current is needed, the input transistors $T_{IN1}$ and $T_{IN2}$ may have feedback that forces the gates of the input transistors $T_{IN1}$ and $T_{IN2}$ to the same voltage, so that the drain currents of the input transistors $T_{IN1}$ and $T_{IN2}$ are equal.

The fourth current generator 350 may generate a current $I_{BIAS4}$ which is the sum of the first bias current $I_{BIAS1}$ for the reference transistor $T_{REF}$ and the current through the first folded cascode transistor T4. One terminal of the fourth current generator 350 may be coupled to the drain terminal of the reference transistor $T_{REF}$ and the source terminal of the first folded cascode transistor T4. The other terminal of the fourth current generator 350 may be coupled to any appropriate component or part of, for example, but not limited to, an amplifier or a buffer circuit. For instance, the other terminal of the fourth current generator 350 may be coupled to a potential similar to that of the fifth current generator 360.

The fifth current generator 360 may generate a current $I_{BIAS5}$ which is the sum of the bias current $I_{BIAS2-1}$ for the first input transistor $T_{IN1}$ and the current through the second folded cascode transistor T5. One terminal of the fifth current generator 360 may be coupled to the drain terminal of the first input transistor $T_{IN1}$ and the source terminal of the second folded cascode transistor T5. The other terminal of the fifth current generator 360 may be coupled to any component or part of, for example, but not limited to, an amplifier or a buffer circuit. For instance, the other terminal of the fifth current generator 360 may be coupled to a potential similar to that of the fourth current generator 350.

The sixth current generator 370 may generate a current $I_{BIAS6}$ which is the sum of the bias current $I_{BIAS2-2}$ for the second input transistor $T_{IN2}$ and a sixth bias current for the third folded cascode transistor T6. One terminal of the sixth current generator 370 may be coupled to the drain terminal of the second input transistor $T_{IN2}$ and the source terminal of the third folded cascode transistor T6. The other terminal of the sixth current generator 370 may be coupled to any component or part of, for example, but not limited to, an amplifier or a buffer circuit.

The currents $I_{BIAS4}$, $I_{BIAS5}$ and $I_{BIAS6}$ may all have the same value when the transistors $T_{REF}$, $T_{IN1}$ and $T_{IN2}$ are identical transistors or have the same configuration and the folded cascode transistors T4, T5 and T6 are identical transistors or have the same configuration.

An ancillary circuitry that may contribute gate leakage current may be coupled to the first input terminal IN1 and/or the second input terminal IN2. For example, a diode for protecting an input transistor can be coupled to the input terminal of the input transistor. In that case, the gate of the zero-gate-current reference transistor $T_{REF}$ may be coupled to another ancillary circuitry. The ancillary circuitry coupled to the gate of the reference transistor $T_{REF}$ may be a copy of the ancillary circuitry coupled to the input terminal IN1 and/or IN2. By coupling another ancillary circuitry, which is a copy of the ancillary circuitry coupled to the input terminal IN1 and/or IN2, to the gate of the reference transistor $T_{REF}$, the operating point of the reference transistor $T_{REF}$ may be such as to create a leakage current that cancels the leakage by the ancillary circuitry coupled to the input transistor $T_{IN1}$ and/or $T_{IN2}$.

In the circuit diagram of FIG. 3, the transistors $T_{IN1}$, $T_{IN2}$ and $T_{REF}$ are each illustrated as N-type MOSFET transistors and the folded cascode transistors T4, T5 and T6 are each illustrated as P-type MOSFET transistors. However, one skilled in the art will recognize that P-type MOSFET transistors could be used for the transistors $T_{IN1}$, $T_{IN2}$ and $T_{REF}$ instead of the N-type MOSFET transistors and N-type MOSFET transistors could be used for the folded cascode transistors T4, T5 and T6.

Figure 4:
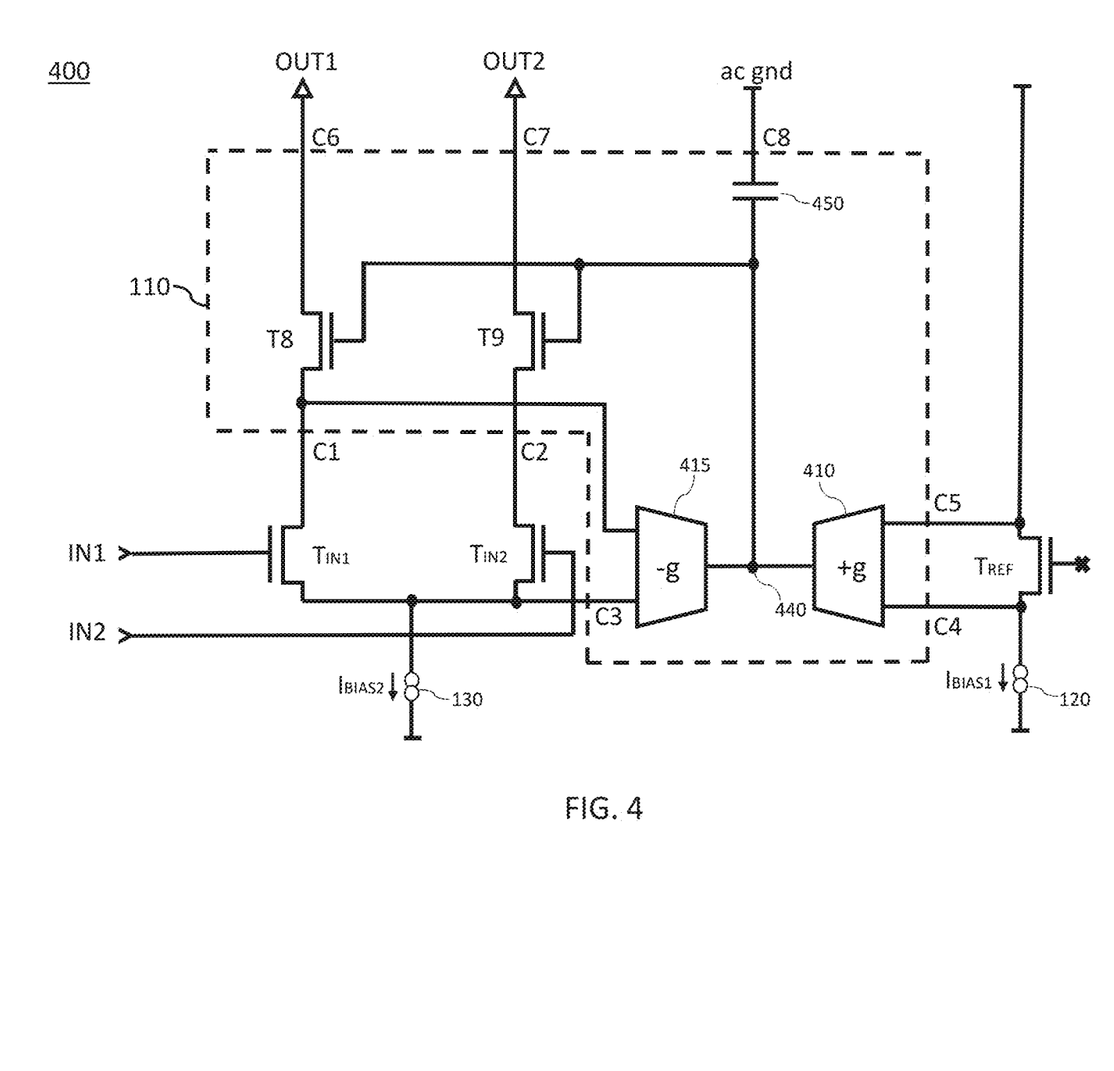
FIG. 4 illustrates an embodiment where a bias control circuit has transconductors.

FIG. 4 illustrates an exemplary embodiment of the bias control circuit 110 having transconductors. The circuit 400 of FIG. 4 may be included in an amplifier, a buffer circuit or any circuit that has an input transistor. The circuit 400 may comprise a reference transistor $T_{REF}$, a differential pair of a first input transistor $T_{IN1}$ and a second input transistor $T_{IN2}$, a first cascode transistor T8, a second cascode transistor T9, a first transconductor 410, a second transconductor 415, a first current generator 120, a second current generator 130 and a capacitor 450

The circuit 400 may have a first input terminal IN1 for receiving a first input signal and a second input terminal IN2 for receiving a second input signal. An input stage of the circuit 400 may be formed by a first input transistor $T_{IN1}$, with a gate coupled to the first input terminal IN1, and a second input transistor $T_{IN2}$, with a gate coupled to the second input terminal IN2. In this embodiment, the drain currents of the first and second cascode transistors T8 and T9 may be coupled into the remainder of the amplifier circuit through a first output terminal OUT1 and a second output terminal OUT2, respectively.

The first input transistor $T_{IN1}$ may have a gate, a drain terminal and a source terminal. The gate of the first input transistor $T_{IN1}$ may be coupled to the first input terminal IN1. The drain terminal of the first input transistor T1 may be coupled to the first cascode transistor T8 and a first input terminal of the second transconductor 415 while the source terminal of the first input transistor $T_{IN1}$ may be coupled to a second current generator 130 and a second input terminal of the second transconductor 415.

The second input transistor $T_{IN2}$ may have a gate, a drain terminal and a source terminal. The gate of the second input transistor $T_{IN2}$ may be coupled to the second input terminal IN2. The drain terminal of the second input transistor $T_{IN2}$ may be coupled to the second cascode transistor T9, while the source terminal of the second input transistor $T_{IN1}$ may be coupled to the source terminal of the first input transistor $T_{IN1}$, the second current generator 130 and the second input terminal of the second transconductor 415. The second input transistor $T_{IN2}$ may the same type of transistor as the first input transistor $T_{IN1}$ (for example, they may have the same layout within an integrated circuit).

The second current generator 130 may supply a bias current $I_{BIAS2}$ for the differential pair of the first input transistor $T_{IN1}$ and the second input transistor $T_{IN2}$. The second current generator 130 forces desired bias currents to the first input transistor $T_{IN1}$ and the second input transistor $T_{IN2}$. One terminal of the second current generator 130 may be coupled to common sources of the first input transistor $T_{IN1}$ and the second input transistor $T_{IN2}$. The other terminal of the second current generator 130 may be coupled to any appropriate component or part of, for example, but not limited to, an amplifier or a buffer circuit, e.g. a circuit ground potential.

As illustrated in FIG. 4, the second current generator 130 may be coupled to both the source terminals of the first input transistor $T_{IN1}$ and the second input transistor $T_{IN2}$. The second current generator 130 may generate a bias current $I_{BIAS2}$ for the first input transistor $T_{IN1}$ and the second input transistor $T_{IN2}$ that is equal to twice the bias current $I_{BIAS1}$.

The first current generator 120 may supply a bias current $I_{BIAS1}$ for the reference transistor $T_{REF}$. The first current generator 120 forces a desired bias current to the reference transistor $T_{REF}$. One terminal of the first current generator 120 may be coupled to the source of the reference transistor $T_{REF}$. The other terminal of the first current generator 120 may be coupled to any appropriate component or part of, for example, but not limited to, an amplifier or a buffer circuit, e.g. a circuit ground potential.

The bias currents for the reference transistor $T_{REF}$, the first input transistor $T_{IN1}$ and the second input transistor $T_{IN2}$ may be all have the same value when the reference transistor $T_{REF}$, the first input transistor $T_{IN1}$ and the second input transistor $T_{IN2}$ are identical transistors or have the same configuration. However, when the size of the first input transistor $T_{IN1}$ or the second input transistor $T_{IN2}$ is different from that of the reference transistor $T_{REF}$, the bias currents $I_{BIAS1}$ and $I_{BIAS2}$ may be scaled according to the transistor sizes to maintain the same current densities.

The reference transistor $T_{REF}$ may have a gate, a drain source terminal, and a source terminal. The gate of the reference transistor $T_{REF}$ may have an open gate connection or may be open circuited, thus zero gate current.

The reference transistor $T_{REF}$ may operate at the same current density as the first input transistor $T_{IN1}$ (and/or the second input transistor $T_{IN2}$). For example, the reference transistor $T_{REF}$ may be identical to the first input transistor $T_{IN1}$ (and/or the second input transistor $T_{IN2}$). Alternatively, the size and/or bias current of the first input transistor $T_{IN1}$ (and/or the second input transistor $T_{IN2}$) and the reference transistor $T_{REF}$ may be different from each other as long as the first input transistor $T_{IN1}$ (and/or the second input transistor $T_{IN2}$) and the reference transistor $T_{REF}$ are scaled in width to operate at the same current density.

The drain terminal of the reference transistor $T_R$y may be coupled to a first input terminal of the first transconductor 410 while the source terminal of the reference transistor $T_{REF}$ may be coupled to a second input of the first transconductor 410.

The bias control circuit 110 may comprise the first transconductor 410, the second transconductor 415, the capacitor 450 and the first cascode transistor T8. The bias control circuit 110 may further comprise the second cascode transistor T9. The cascode transistors T8 and T9 may be identical transistors.

The first transconductor 410 may have a first input terminal, coupled to the drain of the reference transistor $T_{REF}$, a second input terminal, coupled to the source of the reference transistor $T_{REF}$, and an output terminal, coupled to a node 440. The first transconductor 410 may be configured to generate a current which is a linear function of an input differential voltage. Specifically, the first transconductor 410 may generate a current proportional to the drain-source voltage of the reference transistor $T_{REF}$ in response to the drain and source voltages input through the first and second input terminals. The first transconductor 410 may provide a current at its output terminal corresponding to a voltage difference between the drain voltage and source voltage of the reference transistor $T_{REF}$. The output current generated by the first transconductor 410 may be proportional to the drain-source voltage of the reference transistor $T_{REF}$.

The second transconductor 415 may have a first input terminal, coupled to the drain terminal of the first input transistor $T_{IN1}$, a second input terminal, coupled to the source of the first input transistor $T_{IN1}$, and an output terminal, coupled to the node 440. The second transconductor 415 may be configured to generate a current which is a linear function of an input differential voltage. Specifically, the second transconductor 415 may generate a current proportional to the drain-source voltage of the first input transistor $T_{IN1}$ in response to the drain and source voltages input through the first and second input terminals. The second transconductor 415 may provide a current at its output terminal corresponding to a voltage difference between the drain voltage and source voltage of the first input transistor $T_{IN1}$. The output current generated by the second transconductor 415 may be proportional to the drain-source voltage of the first input transistor $T_{IN1}$.

Transconductances of the first transconductor 410 and the second transconductor 415 may have opposite signs to each other. For example, the first transconductor 410 may have a transconductance +g while the second transconductor 415 may have a transconductance −g. At the node 440, the output current of the +g transconductor 410 and the output current of the −g transconductor 415 may cancel each other because the +g transconductor 410 and the −g transconductor 415 have opposite sign transconductances to each other, and their current difference will be provided to the capacitor 450.

The capacitor 450 may be coupled to gates of the first transistor T8 and the second transistor T9. The current flowed from the node 440 may be summed into the capacitor 450 to set the desired gate voltage of the first cascode transistor T8 and the second cascode transistor T9. In the circuit 400, the biasing of the reference transistor $T_{REF}$ may be kept fixed while the gate voltage of the first cascode transistor T8 and the second cascode transistor T9 is free to move to set the drain voltage of the input transistors $T_{IN1}$ and $T_{IN2}$.

An ancillary circuitry that may contribute gate leakage current may be coupled to the first input terminal IN1. For example, a diode for protecting an input transistor can be coupled to the input terminal of the input transistor. In that case, the gate of the zero-gate-current reference transistor $T_{REF}$ may be coupled to another ancillary circuitry. The ancillary circuitry coupled to the gate of the reference transistor $T_{REF}$ may be a copy of the ancillary circuitry coupled to the input terminal IN1 and/or IN2. By coupling another ancillary circuitry, which is a copy of the ancillary circuitry coupled to the input terminal IN1 and/or IN2, to the gate of the reference transistor $T_{REF}$, the operating point of the reference transistor $T_{REF}$ may be such as to create a leakage current that cancels the leakage by the ancillary circuitry coupled to the input transistor $T_{IN1}$ and/or $T_{IN2}$.

If extremely precise cancellation of the gate leakage current is needed, the input transistors $T_{IN1}$ and $T_{IN2}$ may have feedback that forces the gates of the input transistors $T_{IN1}$ and $T_{IN2}$ to the same voltage, so that the drain currents of the input transistors $T_{IN1}$ and $T_{IN2}$ are equal.

Figure 5:
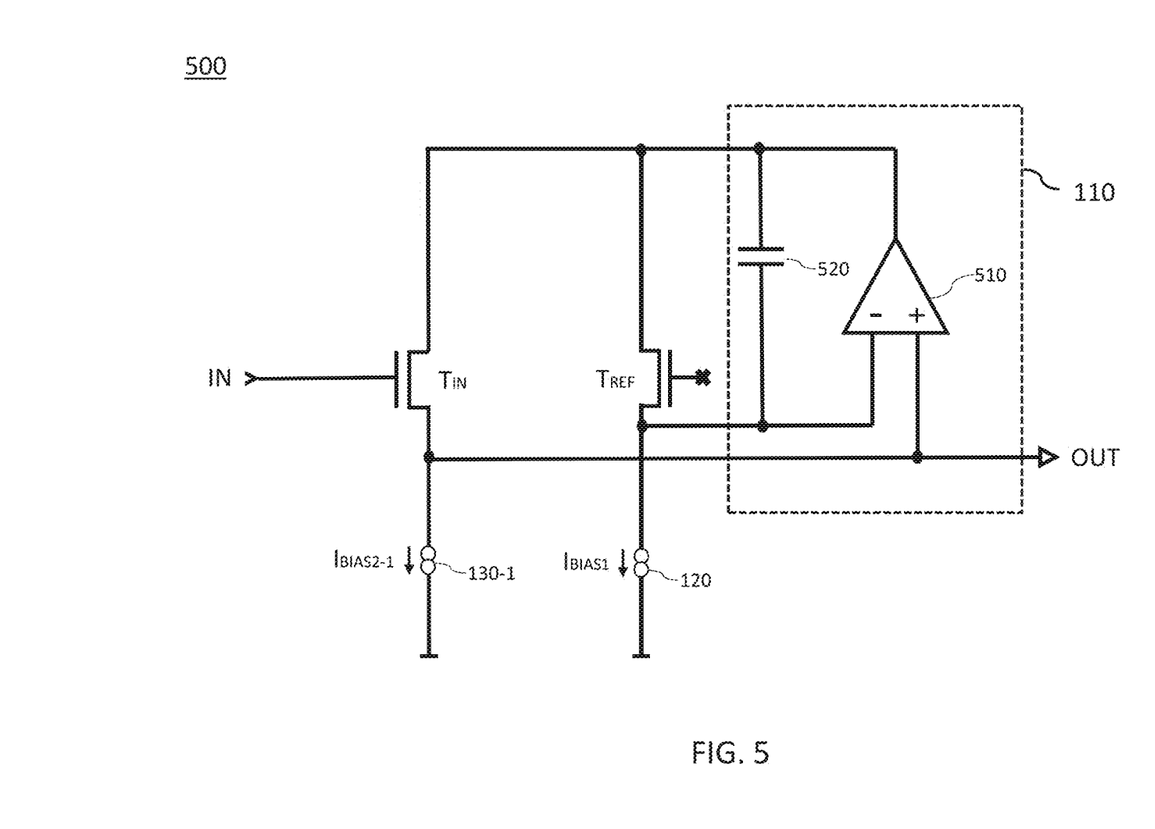
FIG. 5 illustrates a schematic diagram of a bootstrapped source follower circuit in accordance with another embodiment of the present disclosure.

FIG. 5 illustrates a schematic diagram of a bootstrapped source follower circuit in accordance with another embodiment of the present disclosure. The circuit 500 of FIG. 5 may be included in an amplifier, a buffer circuit or any circuit that has an input transistor. The circuit 500 may comprise a reference transistor $T_{REF}$, an input transistor $T_{IN}$, an amplifier 510, a first current generator 120 and a second current generator 130-1. The circuit 500 may further comprise a capacitor 520.

The circuit 500 may have an input terminal IN for receiving an input signal. An input stage of the circuit 500 is formed by the input transistor $T_{IN}$, with a gate coupled to the input terminal IN.

The input transistor $T_{IN}$ may have a gate, a drain terminal and a source terminal. The gate of the input transistor $T_{IN}$ may be coupled to the input terminal IN. The source terminal of the input transistor $T_{IN}$ may be coupled to the positive (non-inverting) input terminal of the amplifier 510, an output terminal OUT and the second current generator 130-1, and the drain terminal of the input transistor $T_{IN}$ may be coupled to the output terminal of amplifier 510 and the drain terminal of the reference transistor $T_{REF}$.

The reference transistor $T_{REF}$ may have a gate, a drain terminal, and a source terminal. The gate of the reference transistor $T_{REF}$ may have an open gate connection or be open circuited, thus having zero gate current.

The reference transistor $T_{REF}$ may operate at the same current density as the input transistor $T_{IN}$. For example, the reference transistor $T_{REF}$ may have the same characteristic as the input transistor $T_{IN}$ (for example, they may have the same layout within an integrated circuit). Alternatively, the size and/or bias current of the input transistor $T_{IN}$ and the reference transistor $T_{REF}$ may be different from each other as long as the input transistor $T_{IN}$ and the reference transistor $T_{REF}$ are scaled in width to operate at the same current density, consistently with the embodiments detailed above.

The source terminal of the reference transistor $T_{REF}$ may be coupled to the negative (inverting) input terminal of the amplifier 510 while the drain terminal of the reference transistor $T_{REF}$ may be coupled to the drain terminal of the input transistor $T_{IN}$.

The first current generator 120 may supply a first bias current $I_{BIAS1}$ for the reference transistor $T_{REF}$. The first current generator 120 forces a desired bias current to the reference transistor $T_{REF}$. One terminal of the first current generator 120 may be coupled to the source of the reference transistor $T_{REF}$. The other terminal of the first current generator 120 may be coupled to any appropriate component or part of, for example, but not limited to, an amplifier or a buffer circuit, e.g. an ac ground.

The second current generator 130-1 may generate a second bias current $I_{BIAS2-1}$ for the input transistor $T_{IN}$. The second current generator 130-1 forces a desired bias current to the input transistor $T_{IN}$. One terminal of the second current generator 130-1 may be coupled to the source of the input transistor $T_{IN}$. The other terminal of the second current generator 130-1 may be coupled to any appropriate component or part of, for example, but not limited to, an amplifier or a buffer circuit, e.g. a circuit ground potential.

The bias currents $I_{BIAS1}$ and $I_{BIAS2-1}$ may have the same value when the reference transistor $T_{REF}$ and the input transistor $T_{IN}$ are identical transistors or have the same configuration. However, when the size of the input transistor $T_{IN}$ is different from the reference transistor $T_{REF}$ are the same, the bias currents $I_{BIAS1}$ and $I_{BIAS2-1}$ may be different from each other and be scaled according to the transistor sizes to maintain the same current densities.

The circuit 500 may comprise the amplifier 510. The amplifier 510 is used to control the drain voltage of the input transistor $T_{IN}$. For example, the amplifier 510 may be an operational amplifier. A positive (non-inverting) input terminal of the amplifier 510 may be coupled to the source of the input transistor $T_{IN}$, while a negative (inverting) input terminal of the amplifier 510 may be coupled to the source of the reference transistor $T_{REF}$. An output terminal of the amplifier 510 may be coupled to the drain terminals of the input transistor $T_{IN}$ and the reference transistor $T_{REF}$.

In operation, the amplifier 510 may sense a voltage difference between the source voltage of the input transistor $T_{IN}$ and the source voltage of the reference transistor $T_{REF}$, and control the drain voltages of the input transistor $T_{IN}$ and reference transistor $T_{REF}$ in order to null the sensed voltage difference.

Optionally, the circuit 500 may further comprise the capacitor 520 to improve the response at higher input frequencies. The capacitor 520 may be coupled to the negative input terminal and the output terminal of the amplifier 510.

An ancillary circuitry that may contribute gate leakage current may be coupled to the input terminal IN. For example, a diode for protecting an input transistor can be coupled to the input terminal of the input transistor. In that case, the gate of the zero-gate-current reference transistor $T_{REF}$ may be coupled to another ancillary circuitry. The ancillary circuitry coupled to the gate of the reference transistor $T_{REF}$ may be a copy of the ancillary circuitry coupled to the input terminal IN. By coupling another ancillary circuitry, which is a copy of the ancillary circuitry coupled to the input terminal IN, to the gate of the reference transistor $T_{REF}$, the operating point of the reference transistor $T_{REF}$ may be such as to create a leakage current that cancels the leakage by the ancillary circuitry coupled to the input transistor $T_{IN}$.

Some embodiments of the circuits disclosed herein may be used in any application requiring accurate determination of a voltage without requiring any current drain from a voltage source. For example, in sample-and-hold circuits, the voltage on a capacitor can be read out over a long period of time without any change in the charge on the capacitor. Furthermore, the circuits according to certain embodiments can be used to determine a voltage from a very high impedance source such as an electrode in a pH meter.

Some embodiments of the circuits disclosed herein may be useful in low power, low noise, high density electronics where an advanced CMOS process with thin gate dielectric needs to be used.

Although the example embodiments have been described in detail, it should be understood that various changes, substitutions and alterations can be made herein without departing from the spirit and scope of the application as defined by the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods, or steps.

What is claimed is:

1. A circuit, comprising:
   a differential pair of first and second input transistors;
   a reference transistor having a gate open-circuited, and operating at the same current density as the differential pair of first and second input transistors; and
   a bias control circuit coupled to the differential pair of first and second input transistors and the reference transistor, and configured to bias the differential pair of first and second input transistors by using a voltage on the reference transistor.

2. The circuit of claim 1, wherein the bias control circuit is configured to bias the differential pair of the first and second input transistors so that the differential pair of the first and second input transistors are operated at the same drain-source voltage as the reference transistor.

3. The circuit of claim 1, wherein the bias control circuit is configured to:
   sense drain-source voltages of the reference transistor and the differential pair of first and second input transistors, and
   drive drain voltages of the differential pair of first and second input transistors so that the drain-source voltage of the differential pair of first and second input transistors match the drain-source voltage of the reference transistor.

4. The circuit of claim 1, wherein the bias control circuit comprises:
   a first cascode transistor coupled to a drain of the reference transistor;
   a second cascode transistor coupled to a drain of the first input transistor;
   a third cascode transistor coupled to a drain of the second input transistor; and
   an amplifier having a first input terminal coupled to a source of the reference transistor, a second input terminal coupled to common sources of the differential pair of first and second input transistors, and an output terminal coupled to gates of the first, second and third cascode transistors.

5. The circuit of claim 4, wherein the amplifier is configured to sense voltage difference between a common source voltage of the differential pair of first and second input transistors and a source voltage of the reference transistor and drive gate voltages of the first, second and third cascode transistors to null the voltage difference.

6. The circuit of claim 1, wherein the bias control circuit comprises:
   a first folded cascode transistor coupled to a drain of the reference transistor;
   a second folded cascode transistor coupled to a drain of the first input transistor;
   a third folded cascode transistor coupled to a drain of the second input transistor;
   an amplifier having a first input terminal coupled to a source of the reference transistor, a second input terminal coupled to common sources of the differential pair of first and second input transistors, and an output terminal coupled to gates of the first, second and third folded cascode transistors;
   a third current generator coupled to the drain of the reference transistor and a source of the first folded cascode transistor;
   a fourth current generator coupled to the drain of the first input transistor and a source of the second folded cascode transistor; and
   a fifth current generator coupled to the drain of the second input transistor and a source of the third folded cascode transistor.

7. The circuit of claim 6, wherein the amplifier is configured to sense voltage difference between a common source voltage of the differential pair of first and second input transistors and a source voltage of the reference transistor and drive gate voltages of the first, second and third folded cascode transistors to null the voltage difference.

8. The circuit of claim 1, further comprising:
   a first current generator configured to generate a first bias current for the reference transistor and coupled to the reference transistor; and
   one or more second current generators configured to generate second bias current(s) for the differential pair of first and second input transistors and coupled to the differential pair of first and second input transistors.

9. The circuit of claim 1, wherein the bias control circuit comprises:
   a first cascode transistor coupled to the first input transistor;
   a second cascode transistor coupled to the second input transistor;
   a first transconductor coupled to the reference transistor and configured to generate a first current proportional to a drain-source voltage of the reference transistor;
   a second transconductor coupled to the first input transistor configured to generate a second current proportional to a drain-source voltage of the first input transistor, wherein transconductance of the second transconductor has an opposite sign to transconductance of the first transconductor; and a capacitor configured to be charged by a current difference between the first current and the second current, and coupled to gates of the first and second cascode transistors.

10. The circuit of claim 9, further comprising:
a first current generator configured to generate a first bias current for the reference transistor and coupled to the reference transistor; and
one or more second current generators configured to generate a second bias current(s) for the differential pair of first and second input transistors and coupled to the differential pair of first and second input transistors.

11. The circuit of claim 1, further comprising:
first ancillary circuitries coupled to input terminals of the differential pair of first and second input transistors; and
a second ancillary circuitry coupled to the gate of the reference transistor, wherein the second ancillary circuitry is a copy of the first ancillary circuitries.

12. A circuit, comprising:
an input transistor having a gate coupled to an input terminal;
a reference transistor having a gate open-circuited, and operating at the same current density as the input transistor; and
a bias control circuit coupled to the input transistor and the reference transistor, and configured to bias the input transistor by using a voltage on the reference transistor.

13. The circuit of claim 12, wherein the bias control circuit comprises an amplifier having a first input terminal coupled to a source of the reference transistor, a second input terminal coupled to a source of the input transistor, and an output terminal coupled to drains of the reference transistor and the input transistor.

14. The circuit of claim 13, wherein the bias control circuit further comprises a capacitor connected to the first input terminal and the output terminal of the amplifier.

15. A method of biasing an input transistor having a gate coupled to an input terminal, the method comprising:

generating a bias current for a reference transistor having an open gate connection and operating at the same current density as the input transistor;
sensing a voltage on the reference transistor; and
biasing the input transistor by using the voltage on the reference transistor.

16. The method of claim 15, wherein, in biasing the input transistor, the input transistor is biased so that the input transistor is operated at the same drain-source voltage as the reference transistor.

17. The method of claim 15, wherein biasing the input transistor comprises:
sensing drain, source or drain-source voltages of the reference transistor and the input transistor; and
driving a drain and/or source voltage of the input transistor so that the drain-source voltage of the input transistor matches the drain-source voltage of the reference transistor.

18. The method of claim 15, wherein biasing the input transistor comprises:
generating, by a first transconductor coupled to the reference transistor, a first current proportional to a source-drain voltage of the reference transistor;
generating, by a second transconductor coupled to the input transistor, a second current proportional to a source-drain voltage of the input transistor, wherein transconductance of the second transconductor has an opposite sign to transconductance of the first transconductor; and
integrating a current difference between the first current and the second current to develop a bias voltage for the input transistor that reduces the current difference.

19. The method of claim 15, wherein the input terminal of the input transistor and an open-circuited gate of the reference transistor are coupled to ancillary circuitries, respectively, which are the same circuitries as each other.

* * * * *